United States Patent [19]
Zingsheim et al.

[11] Patent Number: 5,914,666
[45] Date of Patent: Jun. 22, 1999

[54] AUTO-CONFIGURABLE SERIES COMMUNICATION SYSTEM FOR POWER MONITORS AND THE LIKE

[75] Inventors: Jeffrey S. Zingsheim, Oak Creek; William H. Martin, Franklin; Jeffrey C. Krueger, Waukesha, all of Wis.

[73] Assignee: Allen-Bradley Company, LLC, Milwaukee, Wis.

[21] Appl. No.: 08/706,011

[22] Filed: Aug. 30, 1996

[51] Int. Cl.⁶ ........................................... H04Q 9/00
[52] U.S. Cl. ............................. 340/825.07; 340/825.16; 340/825.17; 340/825.05
[58] Field of Search .................. 340/825.07, 825.16, 340/825.17, 825.05, 825.52, 825.21, 870.41, 870.13, 660, 664; 359/110, 119, 166, 167; 370/258, 243, 449

[56] References Cited

U.S. PATENT DOCUMENTS

| | | | |
|---|---|---|---|
| 4,571,588 | 2/1986 | Lee et al. | 340/870.13 |
| 4,633,246 | 12/1986 | Jones et al. | 340/825.05 |
| 4,982,185 | 1/1991 | Holmberg et al. | 340/825.21 |
| 5,068,850 | 11/1991 | Moore | 370/449 |

*Primary Examiner*—Edwin C. Holloway, III
*Attorney, Agent, or Firm*—Patrick S. Yoder; John J. Horn; John M. Miller

[57] ABSTRACT

A communication system for power monitors and the like includes a plurality of communication nodes connected in series. A technique is provided for automatically detecting the status of the system, including the need to configure the communication nodes or identify the presence and location of a fault. Further, configuration of the nodes is automatically performed as required, and the location of faults is visually represented to assist an operator.

25 Claims, 4 Drawing Sheets

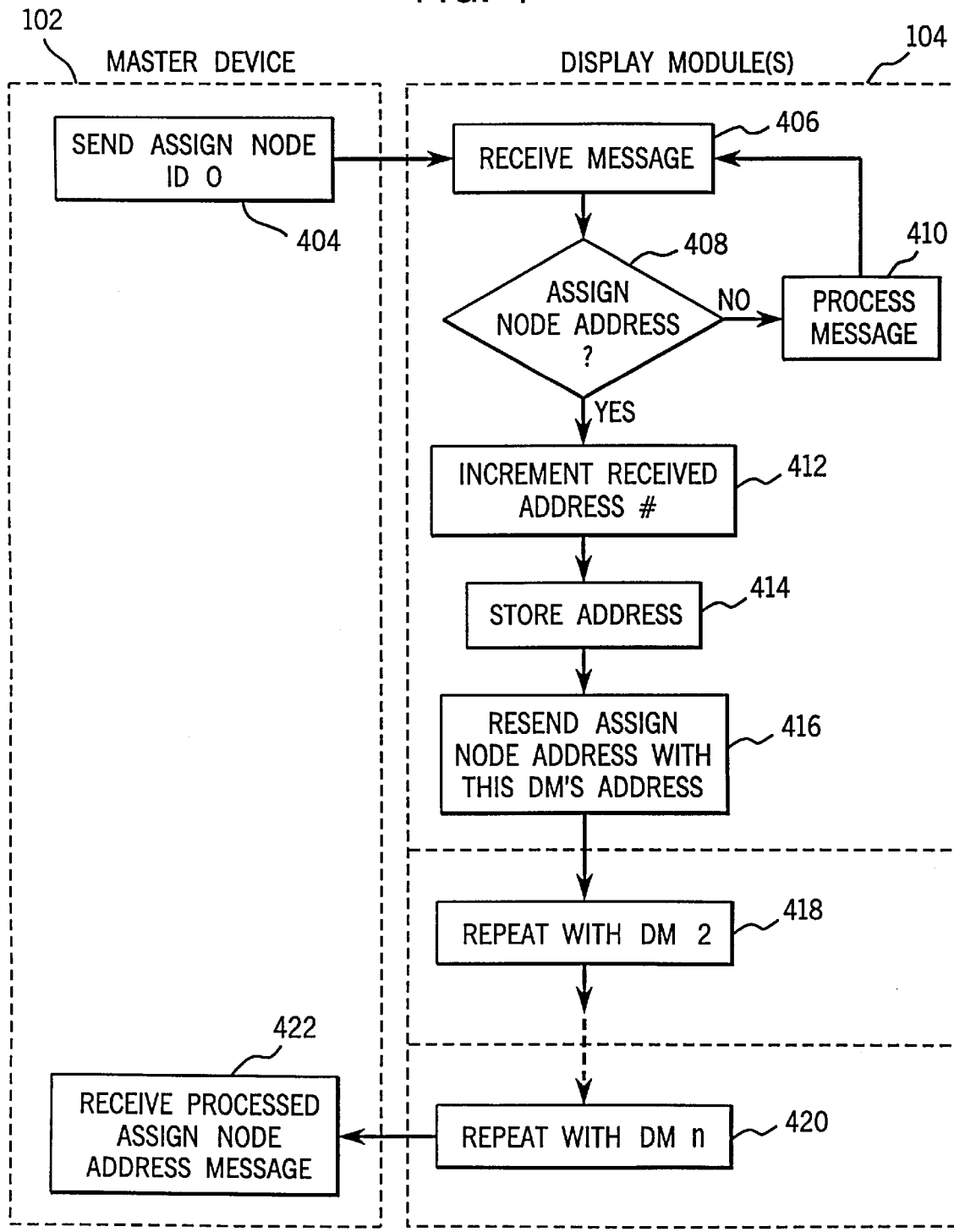

AUTO-CONFIGURABLE SERIES COMMUNICATION SYSTEM FOR POWER MONITORS AND THE LIKE

FIELD OF THE INVENTION

The present invention relates generally to series communication systems, such as for use in electrical power monitoring devices. In particular, the invention relates to a series communication system having multiple communication nodes in which detection of the status of the system, including the need to reconfigure the communication nodes or identify the presence and location of a fault, is automatically performed.

BACKGROUND OF THE INVENTION

Modules for monitoring signals, such as power line signals, are well known in the art. Typically, the monitoring module includes an integral display for providing a visual representation of various parameters of the monitored signals. When used to monitor power, the monitor/display unit must be located in close proximity to the power line, thus limiting easy access by an operator needing to read the display. In addition, when reading the display, the operator may be exposed to high voltage potentials associated with the power line.

Monitoring systems including a display located remote from the monitoring module also are known. The display modules in such systems typically are adapted specifically for the associated monitoring module and may include the intelligence or logic necessary to display the various parameters of the monitored signals. Often, a product-specific cable must be used to interconnect the display and monitoring modules. Although this arrangement provides access to the monitored information remote from the monitoring module and permits the display site to be selectively located or moved, the additional circuitry and components increase the cost and complexity of the overall system. Moreover, system flexibility is limited by restricting the display module to use with a particular type of monitoring module. And most remote systems support only a single display module, limiting access to displayed information to a single site. In systems which support multiple display modules, each display module must have a unique address, identifying its location in the system. Address assignment typically is implemented by hardware, such as dip switches, in the display module. Thus, if display modules are used in another system, an operator may need to reset the dip switches.

Accordingly, it would be desirable to provide a communication system for displaying monitored information at locations remote from the monitoring module. The display module preferably would be electrically isolated from high voltage potentials that may be present at the monitoring location. In addition, the communication system would support multiple display modules, thus providing flexibility in display location and the type of information displayed at each location. Each display module could be used interchangeably in any type of communication system and would not require product-specific interconnections, thus enhancing flexibility while controlling costs. The communication system would automatically configure each display module, providing address and display information, as well as automatically reconfigure the display modules upon adding or removing modules from the system, thus dispensing with cumbersome dip switches that must be manually set by an operator.

In a communication system having multiple interconnected modules, however, the probability of a defective interconnection increases. Accordingly, it would be desirable to provide a communication system that also automatically detects and locates communication failures caused by defective interconnections.

SUMMARY OF THE INVENTION

A first embodiment of the present invention provides an auto-configurable series communication system comprising a master module and first and second slave modules. The master module is configured to transmit and receive data. The data includes a configure command which the master module automatically transmits upon detecting a predefined condition. The first slave module, which is in series communication with the master module, generates a first address in response to the configure command. The first slave module also transmits first address data representative of the first address. The second slave module, which is in series communication with the first slave module and the master module, generates a second address in response to the first address message, and transmits second address data representative of the second address.

A further embodiment of the present invention provides a method for automatically configuring a series communication system having a plurality of communication nodes. A configure command is transmitted upon detection of a predefined condition. A first address, which identifies the location of a first communication node, is generated in response to the configure command. A second address, which identifies the location of a second communication node is generated in response to transmitting first address data. Second address data is transmitted which is representative of the second address.

Another embodiment of the present invention provides a method for determining status of a series communication system having first and second nodes coupled by a series communication link. The first and second nodes are configured to transmit and receive data. The method comprises the steps of transmitting first data from the first node. Receipt of the first data by the second node prior to elapse of a predetermined time interval for response is monitored. The time interval is reset upon receipt of the first data prior to the elapse of the time interval and second data is transmitted from the second node. The method further comprises the step of indicating presence of an abnormal condition upon elapse of the predetermined time interval for response.

A further embodiment of the present invention provides a module for installation in a series communication system. The module comprises an input terminal for receiving input data and an output terminal for transmitting output data. The module is configured to receive first address data at the input terminal which identifies a first location in the communication system. In response to the first address data, the module generates a second address which identifies a second location in the communication system. The module transmits second address data at the output terminal which includes the second address.

BRIEF DESCRIPTION OF THE DRAWINGS

The invention will become more fully understood from the following detailed description, taken in conjunction with the accompanying drawings, wherein like reference numerals refer to like parts, in which:

FIG. 4 is a flow chart illustrating exemplary control logic for configuring and reconfiguring the series communication system of FIG. 1 according to one aspect of the present technique.

DETAILED DESCRIPTION OF THE DETAILED EMBODIMENTS

Figure 1:
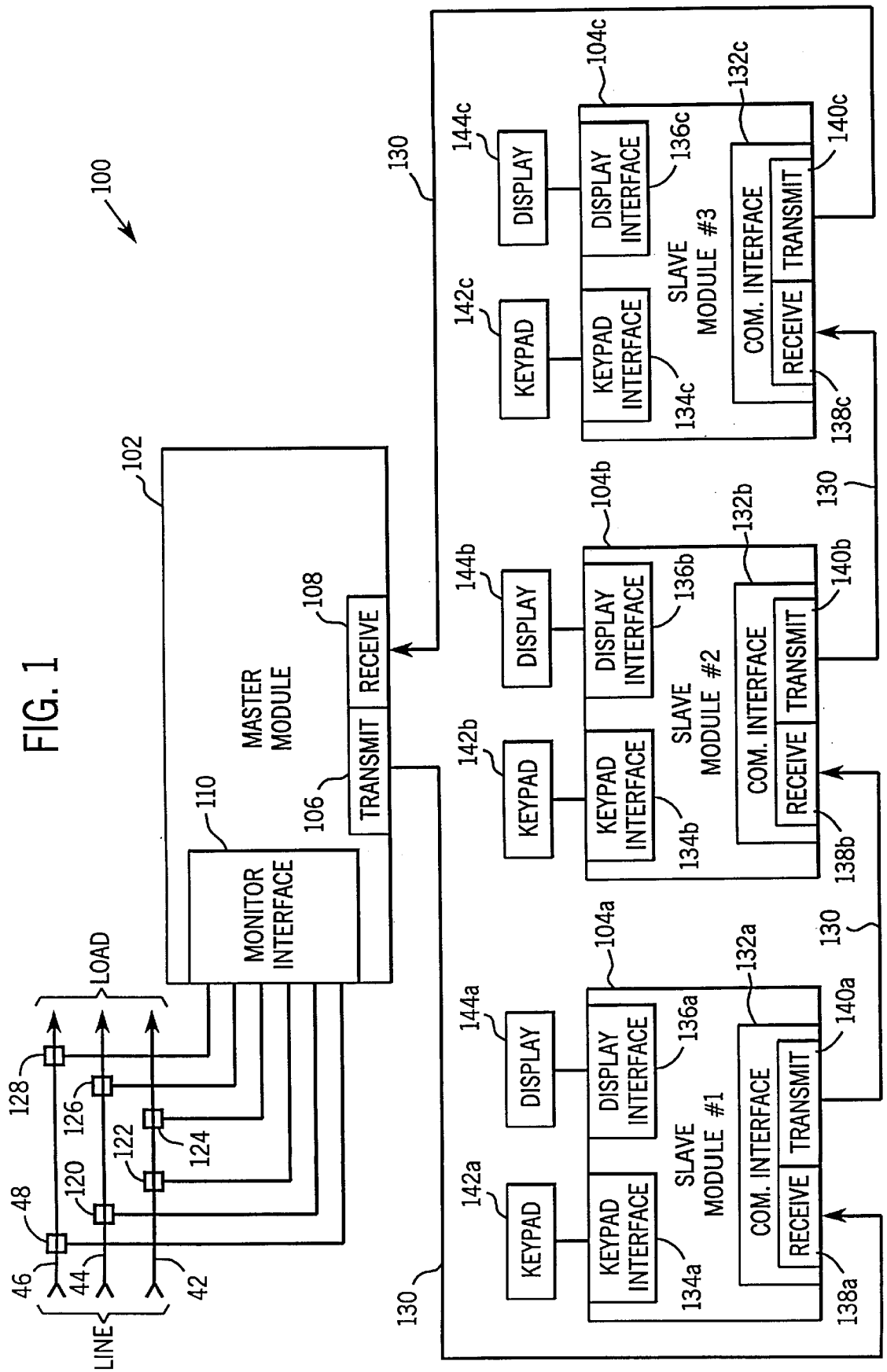
FIG. 1 is a block diagram illustrating a preferred embodiment of a series communication system, including a master module monitoring a power line and three slave modules for displaying selected parameters of the monitored power signals.

Referring to FIG. 1, a block diagram of an exemplary embodiment of a series communication system 100 is illustrated in the context of a power line monitoring and display application. System 100 is configured as a series loop including a master module 102 in communication with slave modules, referred to herein generally by the reference numeral 104, and specifically by numerals 104a, 104b, and 104c. In the preferred embodiment illustrated, up to three slave modules may be connected in series. The addition of more slave modules, however, is limited only by the desirability of minimizing transmission and response time delays throughout the loop as well as the necessity of having the master module maintain control of the slave modules. Slave modules 104a–c are interchangeable, non-product specific devices which are subservient to and may be used with a variety of master modules 102. Master module 102 provides the necessary data and controls the functions performed by slave modules 104a–c.

In the preferred embodiment illustrated in FIG. 1, master module 102 is a power meter and includes a monitor interface 110 for monitoring parameters of power lines 42, 44, and 46. Although a three-phase, three-wire power line is illustrated, system 100 may be used to monitor power in other configurations (e.g., single phase; two-phase; three-phase, four-wire) or may be used to monitor the parameters of other signals applied to monitor interface 110. In the preferred embodiment, however, master module 102 monitors line voltage via transducers 48, 120 and 122 (e.g., voltage transformers) and line current via transducers 124, 126, and 128 (e.g., current transformers). Alternatively, the voltage and current can be monitored directly from power lines 42, 44, and 46. Master module 102 processes the monitored signals to generate data regarding selected parameters for transmission to slave modules 104a–c. For example, master module 102 may generate data regarding metering information, harmonic analysis, power factor, and logging information. The protocol used to transmit the data may be a commercially available, known protocol or may be customized for use in communication system 100. A presently preferred protocol is the DF1 half-duplex data link layer protocol available from Allen Bradley of Milwaukee, Wis.

Data transmitted from master module 102 is received by slave modules 104 via a communication link 130. Communication link 130 includes several link portions which series interconnect master module 102 and slave modules 104a–c. In the preferred embodiment, communication link 130 is a fiber optic link nominally providing 5kV minimum isolation between master module 102 and slave modules 104a–c. However, communication link 130 may also be implemented using a hard-wired or a wireless (e.g., infrared or RF) system.

Each slave module 104 includes a communication interface 132, a keypad interface 134, and a display interface 136. Communication interface 132 includes a receive port 138 and a transmit port 140 for receiving and transmitting data, respectively. Communication interface 132 parses data received via receive port 138 and determines whether the data is intended for use by slave module 104 or for re-transmission via transmit port 140. Communication interface 132 also prepares data (e.g., data from keypad interface 134; a response to a command or inquiry from master module 102) bound for master module 102.

Keypad interface 134 is coupled to a keypad 142 which is accessible by an operator. In the preferred embodiment, keypad interface 134 polls keypad 142 at a fixed interval (e.g., 10 milliseconds) for keypad 142 activity. Alternatively, keypad interface 134 may detect keypad 142 activity in other manners, such as by interrupt detection. Keypad interface 134 communicates validated keystrokes to communication interface 132, which prepares the data for transmission to master module 102. The functions associated with keypad 142 will be explained more fully with reference to FIG. 2.

Display interface 136 is coupled to a display 144 which also is accessible by an operator. Display interface 136 generates signals necessary to control display 144. For example, display interface 136 generates signals to initialize display 144, position a cursor (not shown), blink the cursor, display text, and so forth. In the presently preferred embodiment, all displayed data, with the exception of self-generated diagnostic data (explained more fully below), is provided by master module 102 and processed by communication interface 132 and display interface 136. Alternatively, however, display logic and/or intelligence could be incorporated in slave module 104.

Figure 2:
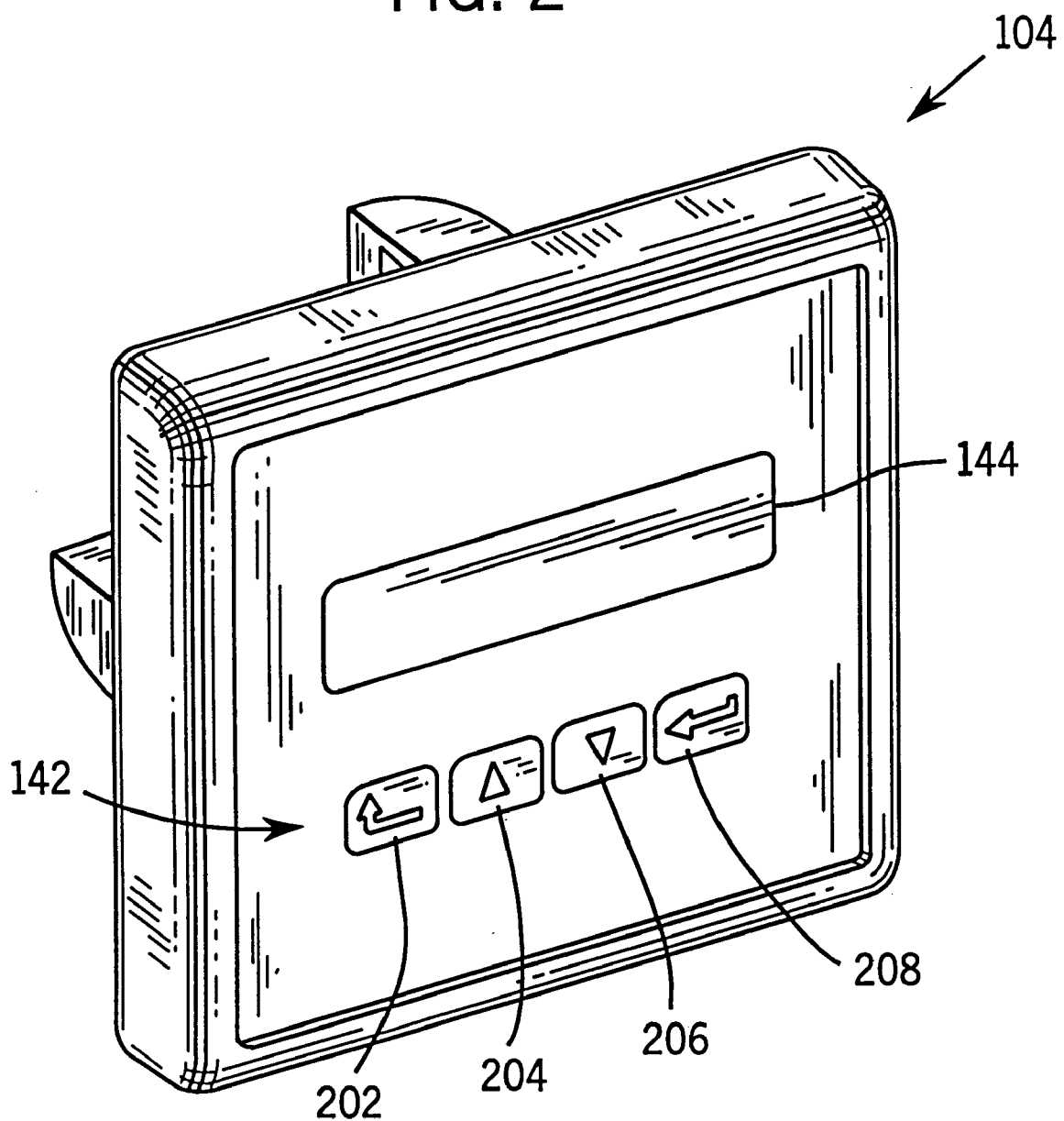
FIG. 2 is a perspective view of an exemplary embodiment of a slave module of FIG. 1 having a display for providing a visual representation of the selected parameters and a keyboard for selecting the parameters to be displayed.

Referring now to FIG. 2, an exemplary embodiment of slave module 104 includes keypad 142 and display 144 which are externally accessible to an operator. Slave module 104 preferably has three modes of operation, namely "Display", "Program", and "Edit", which allow the operator either to view parameters of signals monitored by master module 102 (Display mode) or to alter the configuration of master module 102 (Program and Edit). Keypad 142 provides access to the operation modes and enables the operator to select parameters of signals monitored by master module 102 for viewing on display 144. Display 144 preferably is a flat screen LCD display.

Keypad 142 may include a plurality of membrane keys for performing various functions in each of the modes of operation. For example, in the four-key embodiment illustrated in FIG. 2, key 202 functions as an escape key which either returns the operator to a parent menu or cancels an operation, keys 204 and 206 either step the operator through displayed parameters and menus or increment/decrement displayed values, and key 208 is an enter key which enters values or selects sub-menus. Keystrokes are processed by keypad interface 134 and communication interface 132, and then transmitted to master module 102.

In addition to displaying data transmitted from master module 102, slave module 104 also displays self-generated diagnostic data. For example, slave module 104 may perform a self-test upon power up to determine proper operation of the various internal interface modules and the receive and transmit ports. Failure of any interface or port may be identified on the display. In addition, slave module 104 may perform a diagnostic test of keypad 142. Again, report of a failure may be self-generated and displayed on display 144.

Further, slave module 104 may perform a test to determine the integrity of the communication loop. For example, communications may fail if master module 102 or a slave module 104 is defective or unpowered, or a portion of communication link 130 is broken. In such event, the affected slave module 104 may generate data reporting the status of communication system 100 for display on the associated display 144.

Figure 3:
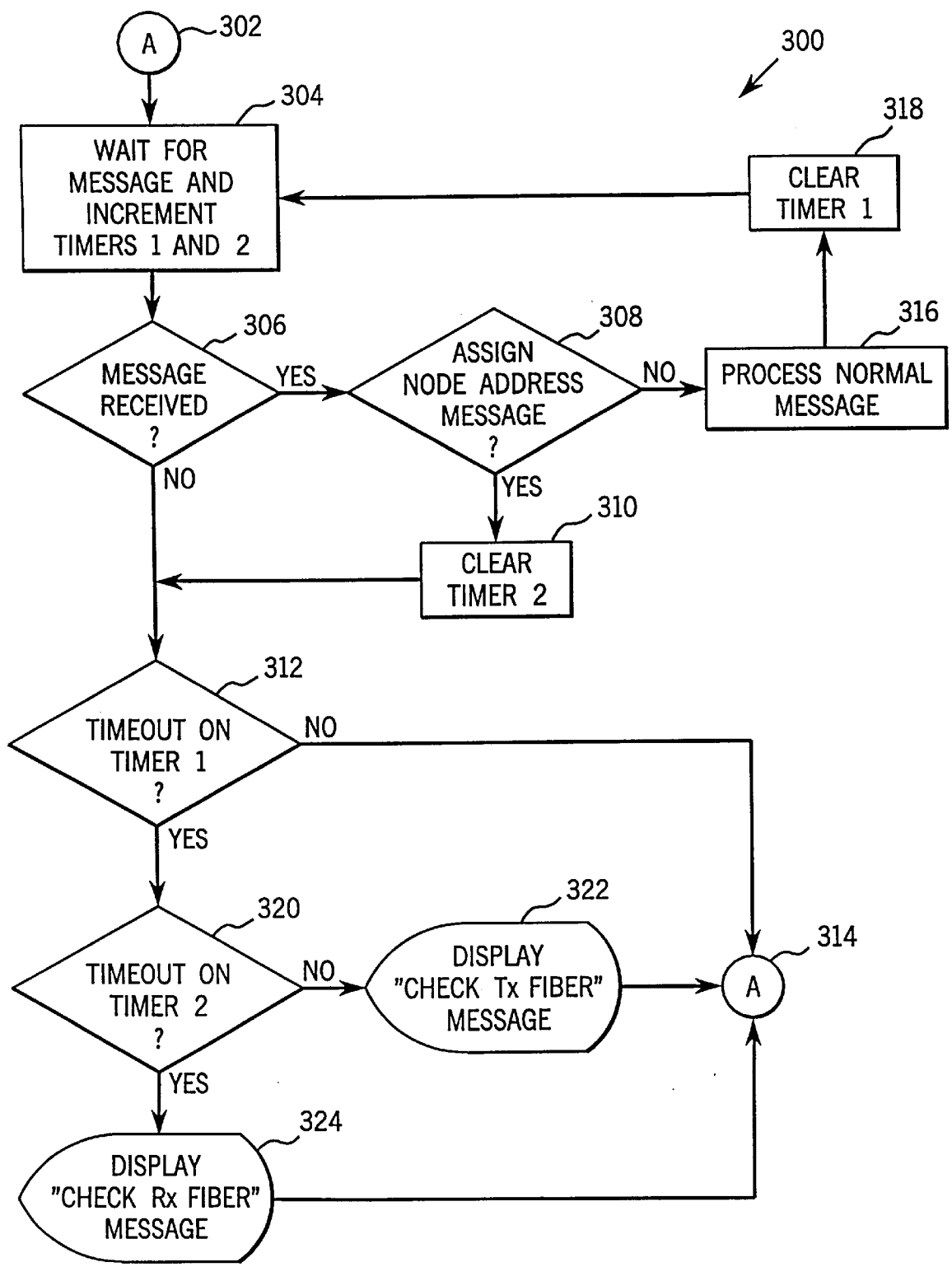
FIG. 3 is a flow chart illustrating exemplary control logic for detecting status of the series communication system of FIG. 1 according to one aspect of the present technique.

FIG. 3 illustrates an exemplary control logic routine 300 implemented in slave module 104 for detecting the status of series communication system 100. A timer 1 and a timer 2 are cleared prior to initiating logic routine 300 at step 302. Timers 1 and 2 set predetermined time intervals during which specified events, such as receipt of an inquiry from master module 102 or a response from a slave module 104, should occur. Elapse of one or both time intervals indicates the presence of a fault in communication system 100. For example, in the preferred embodiment, timer 1 has a time interval of approximately eight seconds. If a slave module 104 does not receive a normal message (i.e., a message other than a configure command) before the eight second interval elapses, then a fault exists upstream. Timer 2, which has a time interval of approximately five seconds, is used to determine whether master module 102 has received a message from slave module 104 in response to a configure command. If master module 102 has not received a response, master module 102 will repeatedly transmit the configure command to slave module 104, indicating a fault downstream of slave module 104. The relationship between timers 1 and 2 will be explained more fully below.

At step 304 in routine 300, slave module 104 waits to receive a message transmitted via communication link 130 and increments timers 1 and 2. If a message is received (step 306), slave module 104 determines whether the message includes a configure command indicating a node address should be assigned (step 308). If the message includes a configure command, then slave module 104 clears timer 2 as illustrated at step 310. Slave module 104 also transmits a response to master module 102 upon receipt of a configure command. If master module 102 does not receive the response, it will repeat the configure command. If repeated configure commands are received by slave module 104, then timer 2 will be cleared repeatedly. At step 312, module 104 determines whether timer 1 has timed out. If not, no fault is deemed to have occurred, and routine 300 proceeds to step 314 for looping back to step 302.

Returning to step 308, if the received message is a message other than a configure command, then the normal message is processed at step 316, timer 1 is cleared at step 318, and routine 300 returns to step 304 to wait for another message and increment timers 1 and 2. If only configure commands are received, then timer 1 will not be cleared and will eventually time out. Thus, elapse of timer 1 always indicates the presence of a fault in communication system 100. Timer 2 is used to identify whether the fault has occurred upstream or downstream of slave module 104.

Steps 312 and 320 illustrate the relationship between timers 1 and 2. If timer 1 has elapsed (a normal message has not been received), but time remains on timer 2 (a configure command has been received), then the response from slave module 104 is not reaching master module 102. Thus, slave module 104 will provide visual indicia on display 144, such as "Check Tx Fiber", assisting the operator in locating the fault (step 322). However, if both timers 1 and 2 have elapsed, then neither a normal message nor a configure command has been received, indicating a problem with the receiving side of slave module 104. Thus, slave module 104 will provide visual indicia on display 144, such as "Check Rx Fiber" (step 324). After displaying the fault diagnosis at either step 322 or 324, routine 300 proceeds to step 314 to loop back to step 302.

Referring now to FIG. 4, a flow chart illustrating preferred, exemplary control logic for automatically configuring series communication system 100 is provided. The auto-configuring logic enhances the flexibility of system 100 by enabling the addition, deletion, or exchange of slave modules 104 without requiring intervention of the operator to manually reconfigure system 100. The auto-configuring logic is initiated upon detection of various predefined events. For example, the logic illustrated in FIG. 4 may be triggered upon application of input power to master module 102. Events in slave modules 104 may also signal the need to configure system 100. For example, in the preferred embodiment, master module 102 periodically polls slave modules 104a–c at a predetermined time interval. If master module 102 has not received a response from a slave module 104a–c within the predetermined time interval (e.g., communication link 130 has been interrupted to add or exchange a slave module 104; or a break exists in communication link 130), master module 102 will initiate the auto-configure logic. Thus, system 100 has the ability to recognize additions, deletions or exchanges of slave modules 104a–c and will respond by automatically configuring or reconfiguring slave modules 104a–c.

In the preferred embodiment illustrated in FIG. 4, master module 102 initiates the auto-configure logic by transmitting to slave module 104 a configure command including an assign node address packet (step 404) identifying a node address. The message is received by slave module 104a (step 406), which is the first slave module in series communication system 100. As discussed above with reference to FIG. 3, slave module 104a first determines whether the message is a normal message or a configure command (step 408). A normal message is processed at step 410 and the logic routine returns to step 406 to await further messages. If the received message is a configure command, then slave module 104a assigns itself a node address by incrementing the node address included in the message (step 412) and storing the incremented address in a memory (step 414). Slave module 104a then retransmits the configure command including the assign node address packet. However, the address packet now contains the incremented node address assigned to module 104a.

The command is received by slave module 104b at step 418, which then repeats the assign address routine. Slave module 104b retransmits the configure command to module 104c, including a second incremented node address. Slave module 104c repeats the routine at step 420 and transmits a third incremented address back to master module 102. At step 422, master module 102 receives the processed configure command and determines the number of slave modules 104 present in communication system 100 by examining the incremented address. Thus, communication system 100 is automatically self-configuring.

The preferred embodiment described is particularly well-suited for use as a power monitoring system which includes a plurality of remote display modules for displaying selected parameters of monitored power at various locations. For example, master module 102 may be located in a power line cabinet while slave modules 104a–c may be located at different locations within a plant. Slave module 104a may be located near the power cabinet and may display RMS voltage. Slave module 104b may be located in a control room in the plant and may display power factor information.

Slave module 104c may be added at a later date in a machine room to display accumulated power drawn by machinery.

Although the foregoing description has been provided for the presently preferred embodiment of the invention, the invention is not intended to be limited to any particular arrangement, but is defined by the appended claims. Various alternative configurations of the invention may occur to those skilled in the art, and to the extent such variations fall within the scope of the claims, they are intended to form a part of the claimed invention. For example, control logic routines implementing alternative steps for determining system status and affecting automatic configuration may readily be envisioned by those skilled in the art.

What is claimed is:

1. An auto-configurable series communication system for monitoring power through a conductor, comprising:
    a master module coupled to the conductor for detecting a plurality of parameters of the power, the master module being configured to transmit data representative of the parameters and a configure command, the master module automatically transmitting the configure command upon detecting a predefined condition;
    a first slave module in series communication with the master module, the first slave module generating a first address indicative of its location in the communication system in response to the configure command, and transmitting first address data representative of the first address; and
    a second slave module in series communication with the master module and the first slave module, the second slave module generating a second address indicative of its location in the communication system in response to the first address data and transmitting second address data representative of the second address;
    wherein the first and second slave modules each include an operator interface for selecting a parameter to be displayed and for displaying visible indicia representative of the selected parameter.

2. The communication system as recited in claim 1, wherein the second address is derived from the first address.

3. The communication system as recited in claim 1, wherein the predefined condition includes elapse of a predetermined time interval for response by the first or second slave module to communications from the master module.

4. The communication system as recited in claim 1, wherein the master module receives input power from a power source and the predefined condition includes application of the input power to the master module.

5. The communication system as recited in claim 1, wherein the master module and the first and second slave modules are in series communication through fiber optic links.

6. The communication system as recited in claim 1, wherein the master module further includes a monitor interface, the monitor interface being configured to monitor the parameters.

7. The communication system as recited in claim 6, wherein the parameters monitored by the monitor interface include voltage in the conductor.

8. The communication system as recited in claim 6, wherein the parameters monitored by the monitor interface include current through the conductor.

9. The communication system as recited in claim 1, wherein the first and second slave modules further include a menu for selecting one of the plurality of parameters of the power signals for representation on the operator interface.

10. A method for configuring a series communication system having a plurality of communication nodes, comprising the steps of
    coupling a master module to a power conductor, the master module being configured to detect a plurality of parameters of power through the conductor;
    coupling first and second slave modules to the master module, each slave module including an operator interface for selecting a parameter to be received from the master module and displayed, the first and second slave modules defining first and second communication nodes, respectively;
    transmitting a configure command from the master module upon detection of a predefined condition;
    generating a first address at the first communication node in the loop in response to the configure command, the first address identifying the location of the first communication node;
    transmitting first address data representative of the first address;
    generating a second address at the second communication node in the loop in response to the first address data, the second address identifying the location of the second communication node;
    transmitting second address data representative of the second address and;
    transmitting from the master module and displaying at the slave modules data representative of the selected parameters based upon the selected parameters and the first and second addresses.

11. The method as recited in claim 10, wherein the step of generating the second address includes deriving the second address from the first address.

12. The method as recited in claim 10, herein the predefined condition includes elapse of a predetermined time interval.

13. The method as recited in claim 10, wherein the communication system receives input power from a power source and the predefined condition includes application of the input power to the system.

14. The method as recited in claim 10, wherein the parameters include voltage from a power line.

15. The method as recited in claim 10, wherein the parameters include current from a power line.

16. A method of determining status of a series communication system having a master node and a plurality of slave nodes, the nodes being coupled by a series communication link and configured to transmit and receive data, the method comprising the steps of:
    transmitting data from the nodes in sequential, series communication;
    monitoring for receipt of the data from the slave nodes prior to elapse of predetermined time intervals;
    resetting the predetermined time intervals upon receipt of the data prior to the elapse of the predetermined time intervals;
    monitoring resetting of the time intervals to determine an abnormal condition in the system and the location of the abnormal condition; and
    indicating a presence of the abnormal condition via a display in at least one of the nodes.

17. The method as recited in claim 16, wherein the abnormal condition is a break in the series communication link.

18. The method as recited in claim 16, wherein at least one of the slave nodes includes an operator interface for displaying visible indicia representative of the presence of the abnormal condition.

19. The method as recited in claim 16, wherein the elapse of a first of the time intervals is indicative of a fault in the communication system and elapse of a second of the time intervals is indicative of a location of the fault on a transmitting or receiving side of the master node.

20. The method as recited in claim 16, wherein the master node includes a monitor interface for monitoring power from a power line.

21. The method as recited in claim 16, wherein the master node executes an autoconfiguration routine following detection of the abnormal condition.

22. A module for installation in a series communication system, the module comprising:

an input terminal for receiving input data;

an output terminal for transmitting output data; and an operator interface for selecting parameter data from a master monitoring device to be displayed on the module;

wherein when placed in service the module generates address data identifying a location of the module in the communication system in response to a configuration command from a master monitoring device, transmits the address data to the master monitoring device, and thereafter, monitors signals from the master monitoring device for the parameter data and displays the parameter data at a location remote from the master monitoring device.

23. The module as recited in claim 22, wherein the module further comprises an operator interface to display visible indicia representative of the input data.

24. The module as recited in claim 23, wherein the module further includes a menu for selecting the input data to be represented on the operator interface.

25. The module as recited in claim 22, wherein the address data is derived from an address from another device upstream of the module in the series communication system.

* * * * *